United States Patent
Kesler et al.

(12) 
(10) Patent No.: US 6,194,884 B1
(45) Date of Patent: Feb. 27, 2001

(54) CIRCUITRY FOR MAINTAINING A SUBSTANTIALLY CONSTANT SENSE CURRENT TO LOAD CURRENT RATIO THROUGH AN ELECTRICAL LOAD DRIVING DEVICE

(75) Inventors: Scott Birk Kesler; Jerral Alan Long, both of Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/447,730

(22) Filed: Nov. 23, 1999

(51) Int. Cl.$^7$ ........................................ G05F 1/56
(52) U.S. Cl. ............................. 323/285; 323/351
(58) Field of Search .................... 323/282, 285, 323/299, 351

(56) References Cited

U.S. PATENT DOCUMENTS

| | | | |
|---|---|---|---|
| 4,961,006 | * 10/1990 | Pace et al. | 323/289 |
| 5,028,861 | * 7/1991 | Pace et al. | 323/285 |
| 5,084,668 | * 1/1992 | Kotowski | 323/280 |
| 5,245,523 | * 9/1993 | Juzswik | 323/315 |
| 5,375,029 | * 12/1994 | Fukunaga et al. | 323/285 |
| 5,396,117 | * 3/1995 | Housen et al. | 327/480 |
| 5,463,306 | * 10/1995 | Berry et al. | 323/285 |
| 5,757,214 | * 5/1998 | Stoddard et al. | 323/282 |
| 5,818,707 | * 10/1998 | Seong et al. | 323/285 |

* cited by examiner

Primary Examiner—Jeffrey Sterrett
(74) Attorney, Agent, or Firm—Jimmy L. Funke

(57) ABSTRACT

Circuitry for driving an electrical load (18) and regulating a load current (IL) therethrough includes a multiple output load driving device (20) having an input (26) receiving a gate drive signal (GD) thereat and operable to direct the load current ($I_L$) therethrough from a collector (28) to main (22) and sense (24) outputs thereof. A control circuit is provided including an error amplifier (52) having a non-inverting input operable to receive a reference voltage and an inverting input operable to receive a sense voltage proportional to the portion of load current ($I_L$) flowing through the sense output (24) of the load driving device (20), and producing an output based thereon to which a gate drive control circuit (54) is responsive to supply the gate drive signal (GD). A feedback capacitor (CFB) is disposed between the collector (28) of the load driving device (20) and a resistor string (R8, R9, RTRIM) establishing the reference voltage, and provides an AC coupling therebetween. This AC coupling compensates for oscillations in the load current ($I_L$) during load current regulation operation and therefore provides for a stable load current ($I_L$) during such operation. In accordance with another aspect of the present invention, the feedback capacitor (CFB) is advantageously formed with an IGBT (20) on a single monolithic integrated circuit.

20 Claims, 3 Drawing Sheets

CIRCUITRY FOR MAINTAINING A SUBSTANTIALLY CONSTANT SENSE CURRENT TO LOAD CURRENT RATIO THROUGH AN ELECTRICAL LOAD DRIVING DEVICE

TECHNICAL FIELD

The present invention relates generally to circuitry for driving electrical loads, and more specifically to such circuitry operable to limit or regulate load current flowing through an inductive load.

BACKGROUND OF THE INVENTION

Heretofore, various circuits have been designed for controlling load current in electrical load driving systems, wherein such circuits have typically been constructed of discrete electrical components, so-called hybrid circuits and integrated circuits. Oftentimes, particularly in the internal combustion engine industry, such circuitry is used in inductive load driving applications such as ignition control systems, fuel control systems and the like.

An example of one known ignition control system includes a low-valued sense resistor disposed in series with a coil current switching device which is itself series-connected to a low side of a primary coil forming part of an automotive ignition coil, wherein the opposite side of the primary coil is connected to a supply voltage. The coil current switching device may be, for example, an insulated gate bipolar transistor (IGBT) having a collector connected to the low side of the coil primary, a gate, and an emitter coupled to ground through the sense resistor. The IGBT is responsive to a gate drive signal to conduct coil current therethrough as is known in the art. As the coil current increases, a voltage is developed across the sense resistor, wherein this voltage is provided to an input of a closed-loop current control circuit operable to modulate the gate drive signal so as to limit and maintain the coil current at a desired coil current limit level. The coil current limit level guarantees sufficient energy in the ignition coil to create a spark for igniting the air/fuel mixture while preventing damage to, or destruction of, the ignition coil or IGBT due to excessive coil current levels.

One drawback associated with ignition control systems of the foregoing type is that the sense resistor must be constructed in such a manner that it is capable of withstanding the high coil current levels and corresponding power levels associated with the typical operation of an automotive ignition coil. This constraint requires a physically large resistor regardless of whether it is provided as a discrete, printed or integrated resistor. Moreover, since the voltage drop across the sense resistor adds to the voltage developed at the low side of the coil primary, the minimum supply voltage at which the ignition control system can achieve the desired coil current limit level is thereby increased. This condition is undesirable since automotive ignition control systems are typically required to be functional at very low battery voltages. Thus, to minimize voltage drop across the sense resistor, it must have a very low resistance value. Low-valued precision resistors, however, are expensive in both discrete and integrated form. Additionally, the power dissipation requirements of the sense resistor typically cause device heating that may lead to changes in the resistor value, ultimately resulting in undesirable corresponding changes in the coil current limit level.

To overcome at least some of the foregoing drawbacks, ignition control systems have heretofore been developed that implement a so-called "sense IGBT"; i.e., an IGBT having a second emitter configured to conduct an output current that is proportional to the "primary" emitter.

One particular example of a known ignition control system 10 implementing a sense IGBT is illustrated in FIG. 1. Referring to FIG. 1, ignition control system 10 includes ignition control circuitry 12 connected to a voltage source VBATT via signal path 14. In the application shown in FIG. 1, VBATT is a conventional automotive battery typically producing an output potential of approximately 14 volts. In any case, a voltage line VIGN is connected between ignition control circuitry 12 and one end of an ignition coil primary 18, wherein the ignition control circuitry 12 is typically operable to switchably provide the VBATT voltage on voltage line VIGN to thereby controllably provide a suitable voltage potential to the coil primary 18. The opposite end of the coil primary 18 is connected to one input of a suitable coil switching device such as, for example, the collector 28 of an IGBT 20. A gate 26 of IGBT 20 is connected to a gate drive output of ignition coil circuitry 12 via signal path 34, and a primary emitter 22 is connected to ground potential. A second "sense" emitter 24 of IGBT 20 is connected to a first end of a sense resistor $R_S$ 30, the opposite end of which is connected to ground potential. The first end of resistor $R_S$ is further connected to an input of known gate control circuitry 32, wherein an output of gate control circuitry 32 is connected to the base 26 of IGBT 20.

With VIGN=VBATT, ignition control circuitry 12 is operable to impress a gate drive voltage GD at the base 26 of IGBT 20. In response to the gate drive voltage GD, IGBT 20 is operable to turn on and conduct a coil current $I_L$ therethrough to ground potential via emitters 22 and 24. The sense emitter 24 is typically sized relative to the primary emitter 22 so that only 1–2% of the total coil current $I_L$ flows through the sense emitter with the remaining coil current IL flowing through the primary emitter 22. As the coil current $I_L$ increases through the inductive load of the coil primary 18, a voltage is developed across the sense resistor $R_S$, wherein this voltage is supplied to the input of gate control circuitry 32. The gate control circuitry 32 forms a closed-loop current control circuit that is typically operable to compare the voltage drop across $R_S$ with a predefined reference voltage, and to control the gate drive voltage GD at a level sufficient to maintain the coil current $I_L$ at a desired current limit level when the voltage drop across $R_S$ reaches the predefined reference voltage.

Since only a small percentage of the total coil current $I_L$ flows through sense emitter 24, the "sense" current flowing through $R_S$ is much less than with the single emitter IGBT-based ignition control system described hereinabove. Accordingly, the sense resistor $R_S$ in system 10 may be larger in value, smaller in physical size and have less power dissipation capability than the sense resistor previously described herein. Such resistors can be easily created in integrated circuit form, thereby permitting $R_S$ to be fabricated on the same semiconductor device as the gate control circuitry 32.

An alternate use of an IGBT, such as IGBT 20, with a sense emitter, such as sense emitter 24, for limiting current through a load is described in U.S. Pat. No. 5,396,117 to Housen et al. The Housen et al. circuit is described as having two modes of operation. In a first mode, "on/off" circuitry is provided that turns the IGBT completely off if a sense current flowing through the sense emitter and sense resistor connected thereto exceeds a predetermined value, thereby providing over-current protection capability. In a second mode, short circuit detection circuitry is provided that steps the IGBT gate drive voltage down to a fixed voltage level, defined by a zener diode breakdown voltage, upon detection of a short circuited load condition. It is important to note, however, that the Housen et al. circuitry does not attempt to otherwise modulate the IGBT gate voltage in a manner that would allow for stable, dynamic current limiting/maintaining of an inductive load.

In any case, while the ignition control system 10 illustrated in FIG. 1 overcomes some of the problems associated with the single-emitter IGBT ignition control system previously described hereinabove, system 10 has certain drawbacks associated therewith. For example, as with dynamic current limit control of any electrical load, and with inductive loads in particular, the control of sense current flowing through sense emitter 24 and resistor $R_S$ is subject to the possibility of loop instability and subsequent oscillation of the load current $I_L$. Moreover, an inherent characteristic of the sense IGBT device 20 further complicates this issue. When the voltage across the collector and emitter terminals (Vce) of a sense IGBT 20 increases, the ratio of current through the sense emitter 24 to the current through the primary emitter 22 also increases, thereby causing the current through the sense emitter 24 to become a larger percentage of the total current $I_L$. In a load current limit control system such as system 10 illustrated in FIG. 1, the IGBT 20 is initially driven with a gate drive voltage GD that is sufficient to drive the IGBT into saturation, thereby resulting in Vce voltages that are low (typically less than 2 volts) relative to the supply voltage VIGN. When the coil current $I_L$ approaches the desired limit level, the gate control circuitry 32 reduces the gate drive voltage GD which causes Vce to increase, thereby causing the coil current $I_L$ to remain constant. Since the control of the coil current $I_L$ is a function of the ratio of the sense emitter current to the primary emitter current, the resulting change in this ratio due to changes in Vce causes perturbations in the gate drive control circuitry 32. These perturbations can lead to oscillation of the coil current $I_L$, wherein such oscillations can be sufficiently severe so as to generate voltages on the secondary coil windings that are high enough to generate a spark event at an associated spark plug. Automotive ignition systems generally require precisely controlled timing of spark events in the engine cylinders, and any oscillation of the ignition coil current $I_L$ during certain critical time periods can cause premature spark events, resulting in rough engine operation, poor emission control and/or engine damage.

What is therefore needed is an improved ignition coil control system for use with a multiple output load driving device that does not suffer from the foregoing drawbacks of known ignition coil control systems.

SUMMARY OF THE INVENTION

The foregoing shortcomings of the prior art are addressed by the present invention. In accordance with one aspect of the present invention, circuitry for driving an electrical load and regulating a load current therethrough comprises a load driving device having a first input responsive to a control signal to conduct a first portion of a load current from a second input to a first output thereof and to conduct a remaining portion of the load current from the second input to a second output thereof, means for sensing the first portion of the load current and producing a sense signal corresponding thereto, means for generating a reference signal, a control circuit responsive to the sense and reference signals to provide the control signal at a first signal level when the sense signal is below the reference signal and to reduce the control signal to a load current regulating level as the sense signal approaches said reference signal, and a feedback path establishing a feedback signal between the second input of the load driving device and the means for generating a reference signal, the feedback signal modulating the reference signal to thereby maintain a substantially constant ratio of the first portion of the load current to the load current.

In accordance with another aspect of the present invention, a method of driving an electrical load and regulating a load current therethrough comprises the steps of driving a load energizing device with a control signal at a level sufficient to permit a load current equivalent to that demanded by an electrical load connected to the load energizing device to flow therethrough, sensing a portion of the load current and producing a sense signal corresponding thereto, providing means for generating a reference signal, comparing the sense signal with the reference signal and reducing the control signal to a load current regulating level as the sense signal approaches the reference signal, and directing a feedback signal from a common connection of the electrical load and the load energizing device to the means for generating a reference signal, the feedback signal maintaining a substantially constant ratio of the portion of the load current to the load current.

In accordance with yet another aspect of the present invention, circuitry for driving an electrical load and regulating a load current therethrough comprises an insulated gate bipolar transistor (IGBT) having a gate, a collector and at least two emitters, the IGBT responsive to a gate drive signal to conduct a first portion of a load current from the collector to a first one of the at least two emitters and a second portion of the load current from the collector to a second one of the at least two emitters, a current sensor sensing the first portion of the load current and producing a sense signal corresponding thereto, a reference signal generating circuit, a control circuit responsive to the sense and reference signals to control the gate drive signal to a load current regulating level as the sense signal approaches the reference signal, and a feedback path establishing a feedback signal between the collector and the reference signal generating circuit, the feedback signal modulating the reference signal in proportion to changes in a voltage between the collector and the at least two emitters.

One object of the present invention is to provide improved circuitry for driving an electrical load and regulating the load current flowing therethrough.

Another object of the present invention is to provide such circuitry including a load driving device comprising at least two current flow paths whereby a main load current flows through one such path to a reference potential and a small portion of the load current flows through another such path, and wherein the small portion of load current is monitored for limiting the load current to a desired value.

Yet another object of the present invention is to provide such circuitry that allows limiting of the load current flowing through the electrical load in a stable manner to a substantially constant current value.

Still another object of the present invention is to provide such circuitry that is fully integratable into one or more monolithic integrated circuits.

These and other objects of the present invention will become more apparent from the following description of the preferred embodiment.

BRIEF DESCRIPTION OF THE DRAWINGS

The present invention will now be described, by way of example, with reference to the accompanying drawings, in which.

DESCRIPTION OF THE PREFERRED EMBODIMENT

Figure 1:
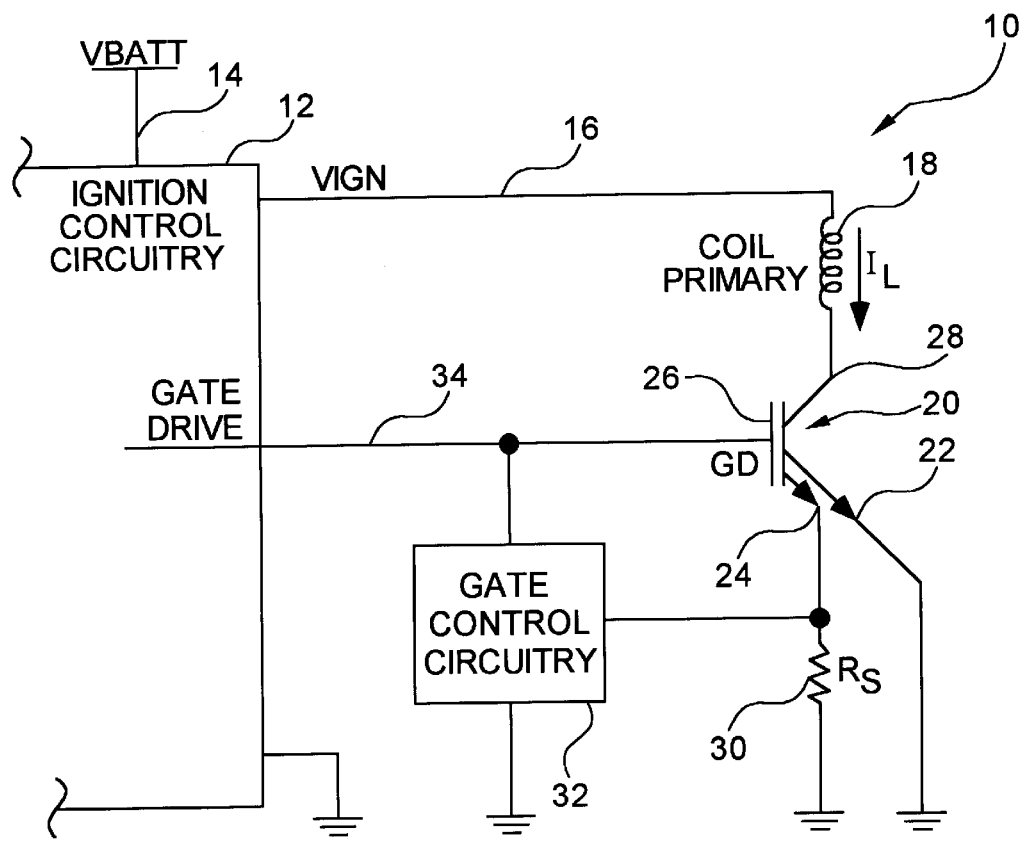
FIG. 1 is a schematic diagram illustrating one known ignition control system utilizing a multiple emitter IGBT as the load driving device.
Figure 2:
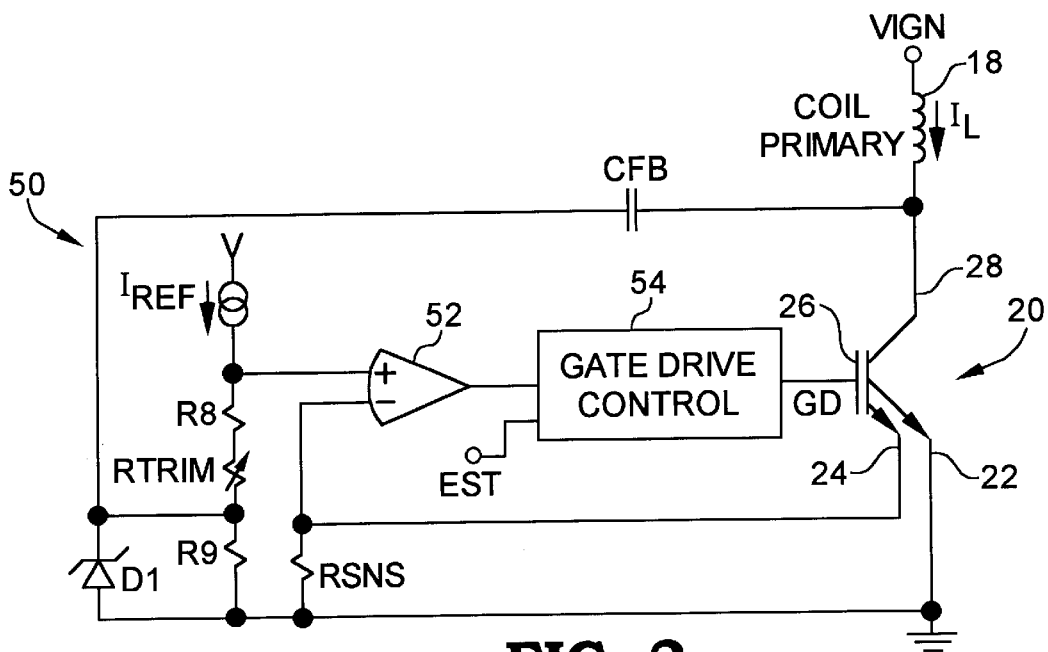
FIG. 2 is a schematic diagram illustrating one preferred embodiment of an improved ignition control circuit for use with a multiple output load driving device, in accordance with the present invention.

Referring now to FIG. 2 one preferred embodiment of an ignition control circuit 50 for use with a multiple output load driving device 20, in accordance with the present invention, is shown. Load driving device 20 is preferably an insulated gate bipolar transistor (IGBT) identical in operation to IGBT 20 of FIG. 1, and like reference numbers are therefore used in FIG. 2 to identify like components thereof. Those skilled in the art will recognize, however, that the concepts of the present invention apply to other multiple output load driving devices, such as multiple source metal-oxide-semiconductor field effect transistors (MOSFETs) and junction field effect transistors (JFETs), multiple emitter bipolar junction transistors (BJTs), and the like. The control circuitry utilizing the concepts of the present invention to control such other multiple output load driving devices is intended to fall within the scope of the present invention, although the load driving device described hereinafter for use with the control circuitry 50 of the present invention will be limited to IGBT 20.

In any case, circuit 50 includes an error amplifier 52 having an inverting input connected to a sense emitter 24 of IGBT 20 and to one end of a sense resistor RSNS. A non-inverting input of error amplifier 52 is connected to one end of a resistor R8 and to an output of a current source operable to supply a reference current $R_{REF}$. The opposite end of R8 is connected to one end of a trimmable resistor RTRIM, the opposite end of which is connected to one end of a resistor R9, a cathode of a zener diode D1 and one end of a feedback capacitor CFB. The opposite end of R9 and the anode of D1 are connected to ground potential, as is the main or primary emitter 22 of IGBT 20. The opposite end of CFB is connected to the common connection of the low side of coil primary 18 and the collector 28 of IGBT 20, and the high side of coil primary 18 is connected to a suitable voltage source VIGN.

RTRIM is preferably a trimmable resistor, whereby the value of RTRIM may be adjusted in a known manner after construction of circuit 50. For example, RTRIM may include a resistor ladder structure having fusable links therebetween whereby the value of RTRIM may be upwardly adjustable by selectively opening one or more of the fusable links. Alternatively or additionally, RTRIM may include a resistor ladder structure having zener diodes therebetween whereby the value of RTRIM may be upwardly or downwardly adjustable by selectively directing sufficient current through one or more of such zener diodes to create an electrical short therethrough. Alternatively still, RTRIM may be laser trimmable in that the value of RTRIM may be adjusted, typically upwardly, by selectively directing laser radiation onto the surface of RTRIM. In any case, the value of RTRIM may be adjusted at any time following the construction of circuit 50, and is preferably adjusted after connecting IGBT 20 thereto as shown in FIG. 2.

The output of error amplifier 52 is connected to a first input of a gate drive control circuit 54, wherein circuit 54 also defines a second electronic spark timing (EST) input. An output of gate drive control circuit 54 is connected to the gate 26 of IGBT 20. The EST input is adapted to receive an electronic spark timing control signal (EST signal) from external circuitry (not shown) such as a microprocessor, computer, controller, application specific integrated circuit (ASIC) or other circuitry, whereby the gate drive control circuit 54 is responsive to the EST signal to activate/deactivate IGBT 20 as will be described in greater detail hereinafter.

In operation, gate drive control circuit 54 is responsive to an EST signal to provide a predefined gate drive voltage (GD) to the gate 26 of IGBT 20. The gate drive voltage GD supplied by gate drive control circuit 54 is sufficiently high so as to cause the collector-to-emitter voltage (Vce) of IGBT 20 to collapse to the saturation voltage of IGBT 20. At this point, most of the voltage supplied by voltage source VIGN appears across the coil primary 18, thereby causing a load current $I_L$ to begin flowing therethrough and, in turn, from the collector 28 of IGBT to each of the main 22 and sense 24 emitters. Due to the inductance of the coil primary 18, and ignoring for the moment any affect of D1 and CFB, the load current $I_L$ increases over time until the voltage developed across the sense resistor RSNS is close to the voltage drop across the series combination of R8, R9 and RTRIM. At this point, the output of the error amplifier 52 causes the gate drive control circuit 54 to reduce the gate drive voltage GD in a linear fashion, wherein an equilibrium condition or balance point is eventually reached such that the voltage across RSNS is equal to the voltage drop across the series combination of R8, R9 and RTRIM and the gate drive voltage is at a level necessary to hold the load current $I_L$ at a desired level.

The stability problem discussed hereinabove in the BACKGROUND section results because the sense emitter 24 of IGBT 20 sources more current for higher Vce voltages of IGBT 20 than for lower Vce voltages of IGBT 20, even though the load current $I_L$ may be the same in each case. Consequently, the voltage drop across RSNS is thus higher for higher IGBT Vce voltages than for lower IGBT Vce voltages. As the gate drive voltage GD is being reduced by the error amplifier 52, the Vce voltage of IGBT 20 is increasing rapidly, thereby causing the voltage drop across RSNS to increase, whereby it appears to the error amplifier 52 that the load current $I_L$ is larger than its actual value. The error amplifier 52 attempts to counter the increasing voltage drop across RSNS by further reducing the gate drive voltage GD, thereby causing the Vce voltage of IGBT 20 to increase further. This, of course, increases the current flowing through sense emitter 24 and, resultantly, the voltage drop across RSNS.

The foregoing circuit behavior is effectively positive feedback and results in a positive ringing voltage on the collector 28 of IGBT 20. Once the Vce voltage of IGBT 20 begins to stabilize, the inductive ringing reverses itself and the voltage at the collector 28 of IGBT begins to fall. The current through sense emitter 24 correspondingly falls, thereby decreasing the voltage drop across RSNS. Because of the decreasing voltage drop across RSNS, it appears to the error amplifier 52 that the load current $I_L$ is now smaller than its actual value, and responds by increasing the gate drive voltage GD. This causes the Vce voltage of IGBT 20 to decrease further, thereby further decreasing the current flowing through sense emitter 24 as well as the voltage drop across RSNS.

The foregoing circuit operation results in oscillations in the load current $I_L$ when attempting to limit $I_L$ to a predefined "hold" value. The stability of circuit 50, without D1 and CFB, is largely dependent upon the impedance of the coil primary 18, wherein the impedance of a typical coil primary 18 is of such a nature as to move the operation of typical coil current control circuits toward regions of operative instability, and wherein minor perturbations to the control loop may result in substantial oscillation of the load current $I_L$. The change in the ratio of current through sense emitter 24 to the current through the main emitter 22 during the time that the control circuit 50 (without D1 and CFB) is attempting to decrease the gate drive voltage GD causes sufficient perturbations to the control loop that result in oscillations in the load current IL The present invention addresses the foregoing problem by feeding back to the error amplifier input circuitry (R8, R9, RTRIM) the voltage change Vce affecting the sense emitter 24 to main emitter 22 current ratio. The change in Vce voltage is, in accordance with the present invention, sampled from the collector 28 of IGBT 20, and used to modify the reference voltage appearing at the non-inverting input to error amplifier 52 against which the voltage drop across RSNS is compared. As the voltage drop across RSNS increases due to increasing current flow through sense emitter 24 resulting from an increase in Vce voltage of IGBT 20 as described hereinabove, the resultant effect on the inverting input of error amplifier 52 is offset by correspondingly increasing the reference voltage at the non-inverting input of error amplifier 52 by an amount proportional to the voltage at the collector 28 of IGBT 20.

In accordance with the present invention, the effect on error amplifier 52 of an increasing voltage drop across RSNS due to increasing current flow through sense emitter 24 resulting from an increase in Vce voltage of IGBT 20 is offset by capacitively coupling the collector 28 of IGBT 20 to the resistor structure (R8, R9, RTRIM) that establishes the reference voltage at the non-inverting input of error amplifier 50. As shown in FIG. 2, one preferred embodiment of the capacitive coupling is shown wherein CFB is disposed between the collector 28 of IGBT 20 and the common connection of RTRIM, R9 and D1. By implementing the capacitive feedback technique of the present invention, the DC operating point of circuitry 50 is not affected since, once the transition into current limiting operation is complete, no current flows back into the feedback capacitor CFB.

CFB is operable to transfer any AC signal at the collector 28 of IGBT 20 to the common connection of RTRIM, R9 and D1. As the Vce voltage at the collector 28 of IGBT 20 increases in response to the gate voltage GD being reduced during load current limiting as described hereinabove, current flows through R9, thereby increasing the voltage drop across R9 and, in turn, increasing the reference voltage at the non-inverting input of error amplifier 52. The error amplifier 52 is operable to linearly adjust its output signal to gate drive control circuit 54 as a function of the reference voltage at its inverting input and the voltage drop across RSNS, and as the reference voltage increases due to the increasing Vce voltage at the collector 28 of IGBT 20, the error amplifier 52 causes the gate drive control circuit 54 to increase the gate drive voltage GD. This additional gate drive results in a decrease in the Vce voltage of IGBT 20, thereby compensating for any tendency of the Vce voltage of IGBT 20 to ring in the positive direction. The negative feedback established by capacitor CFB thus tends to stabilize the control loop and damp any oscillatory behavior. Diode D1 is included to clamp the voltage across R9 to a level low enough to protect the non-inverting input of error amplifier 52 from damage in the case of a very quickly rising voltage at the collector 28 of IGBT 20, which may occur when the gate drive control circuit 54 deactivates the gate drive voltage GD, and thereby deactivates IGBT 20, at the end of a dwell cycle. Those skilled in the art will recognize that the value of capacitor CFB, as well as the amount of resistance onto which the AC coupled signal is forced, will depend, at least in part, upon the particular characteristics of the coil primary 18, the transconductance of IGBT 20, and bias considerations in the error amplifier 52.

Figure 3:
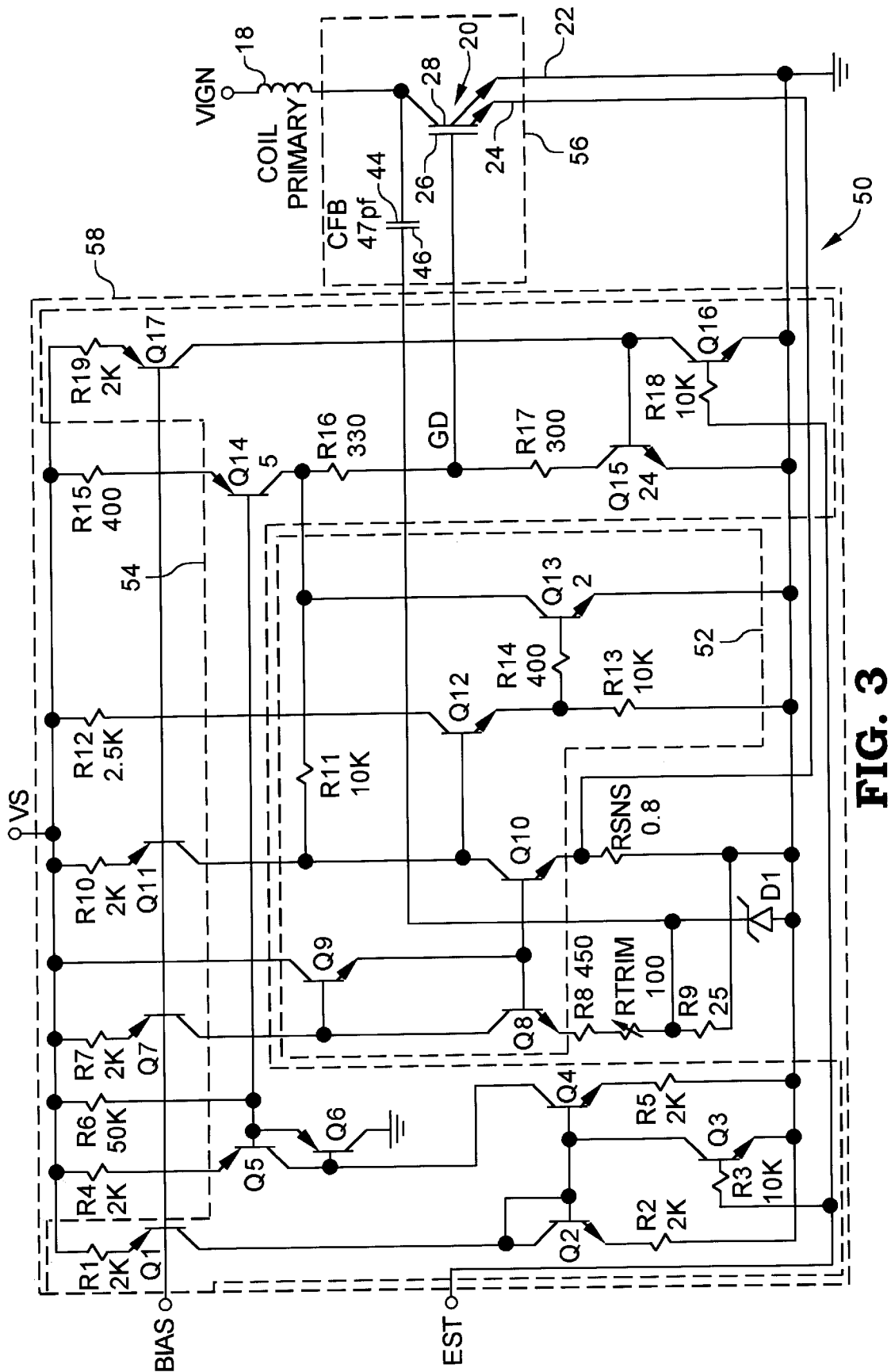
FIG. 3 is a device level schematic illustrating one preferred embodiment of a device level implementation of the ignition control circuit of FIG. 2.

Referring now to FIG. 3, one preferred embodiment of a device-level schematic representation of the ignition control circuitry 50 of FIG. 2, in accordance with the present invention, is shown. In the following description of the control circuitry 50 of FIG. 3, resistor values and bipolar transistor emitter areas (referenced to an emitter area of "1") in accordance with one specific embodiment of circuit 50 will be given, although it is to be understood that circuit 50 may alternatively be constructed with other resistor values and emitter areas without detracting from the scope of the present invention. Those skilled in the art will recognize that the values of resistors and emitter areas are typically a matter of design choice and will, in many cases, be dictated by the application of circuit 50, physical components used with circuit 50, and other factors.

In any case, circuit 50 of FIG. 3 includes a PNP transistor Q1 having an emitter connected to one end of a resistor R1, the opposite end of which is connected to a voltage source VS. The base of Q1 is connected to a BIAS input which is adapted to receive a bias voltage for turning on and off PNP transistor current sources Q1, Q7, Q11 and Q17. The collector of Q1 is connected to a base and collector of a NPN transistor Q2, to the collector of another NPN transistor Q3 and to the base of yet another NPN transistor Q4. The emitter of Q2 is connected to one end of a resistor R2, the base of Q3 is connected to one end of a resistor R3, and the emitter of Q4 is connected to one end of a resistor R5. The emitter of Q3 and the opposite ends of resistors R2 and R5 are connected to ground reference, and the opposite end of R3 is connected to the EST input of the gate drive control circuit 54 (see also FIG. 2) as well as to one end of a resistor R18. The collector of Q4 is connected to the collector of a PNP transistor Q5 and to the base of another PNP transistor Q6 having a collector connected to ground reference. The emitter of Q5 is connected to one end of a resistor R4 having an opposite end connected to VS. The base of Q5 is connected to the emitter of Q6, to one end of a resistor R6 and to the base of another PNP transistor Q14 having a 5× emitter area. The emitter of Q14 is connected to one end of a resistor R15, wherein the opposite ends of R6 and R15 are connected to VS.

A resistor R7 is connected between VS and the emitter of a PNP transistor Q7 having a base connected to the BIAS input and a collector connected to the collector of a NPN transistor Q8 and to the base of another NPN transistor Q9. The emitter of Q9 is connected to the base of Q8 and to the base of another transistor Q10, and the emitter of Q8 is connected to one end of a resistor R8. As discussed with reference to FIG. 2, the opposite end of R8 is connected to one end of a trimmable resistor RTRIM, the opposite end of which is connected to one end of a resistor R9, to the cathode of a diode D1 and to one end 46 of a feedback capacitor CFB. The opposite end of R9 is connected to ground reference and to one end of sense resistor RSNS. The opposite end of RSNS is connected to the emitter of Q10 and to the sense emitter 24 of IGBT 20. The collector of Q10 is connected to the collector of a PNP transistor Q11, to the base of a NPN transistor Q12 and to one end of a resistor R11. The base of Q11 is connected to the BIAS input and the emitter is connected to one end of a resistor R10, the opposite end of which is connected to VS. The collector of Q12 is connected to one end of a resistor R12, the opposite end of which is connected to VS, and the emitter of Q12 is connected to one end of a resistor R13 and to one end of a resistor R14. The opposite end of R13 is connected to ground reference, and the opposite end of R14 is connected to the base of a 2 × emitter NPN transistor Q13. The emitter of Q13 is connected to ground reference and the collector of Q13 is connected to the opposite end of R11, to one end of a resistor R16 and to the collector of Q14. As shown by dashed outline in FIG. 3, transistors Q8–Q13 form, in this embodiment, the error amplifier 52 of FIG. 2, and resistor R11 provides local gain reducing feedback from the gate drive output GD to the base of Q12. Q8 and Q10 form a differential measurement pair that compares the voltage drop across RSNS with the reference voltage developed at the emitter of Q8, wherein the reference voltage at the emitter of Q8 is the current sourced by Q7 times the total resistance of the series connection of R8, R9 and RTRIM. Transistors Q12 and Q13 provide the amplifier gain via the known Darlington-style connection thereof.

The opposite end of R16 is connected to one end of a resistor R17 and to the gate 26 of IGBT 20. The common connection of R16 and R17 defines the output of gate drive control circuit 54 (shown by dashed outline in FIG. 3), and therefore provides the gate drive signal GD. The opposite end of R17 is connected to the collector of a 24x emitter NPN transistor Q15 having a base connected to the collector of a NPN transistor Q16 and to the collector of a PNP transistor Q17. The base of Q16 is connected to the opposite end of R18, and the emitters of Q15 and Q16 are connected to ground reference. The base of Q17 is connected to the BIAS input and the emitter is connected to one end of a resistor R19, the opposite end of which is connected to VS. As shown by dashed outline in FIG. 3, transistors Q1–Q6 and Q14–Q17 form the gate control circuit 54 illustrated in FIG. 2. Charging current for gate 26 of IGBT 20 is produced by the two current mirrors composed of Q2 and Q4, and the Q5, Q6, Q14 combination. Q15 discharges the gate 26 when the dwell cycle ends and production of a spark event is desired.

The opposite end 44 of feedback capacitor CFB is connected to the collector 28 of IGBT 20 and to the low end of coil primary 18. The high end of coil primary 18 is connected to a supply voltage VIGN and the main emitter 22 of IGBT is connected to ground reference. As shown by dashed outline 58 in FIG. 3, the error amplifier 52, gate drive control circuit 54, resistors R8, R9, RTRIM and RSNS, diode D1 and current source circuitry Q1–7, Q11, R1–7 and R10 are preferably formed on a single monolithic integrated circuit 58 fabricated in accordance with a known silicon bipolar fabrication process. Alternatively, feedback capacitor CFB could be included within circuitry 58, although doing so would significantly increase the required surface area of integrated circuit 58. In any case, those skilled in the art will recognize that integrated circuit 58 and its components could alternatively be fabricated in accordance with other known circuit fabrication processes including, but not limited to, metal-oxide-semiconductor (MOS), bipolar complementary MOS (biCMOS) and other known fabrication processes.

Figure 4:
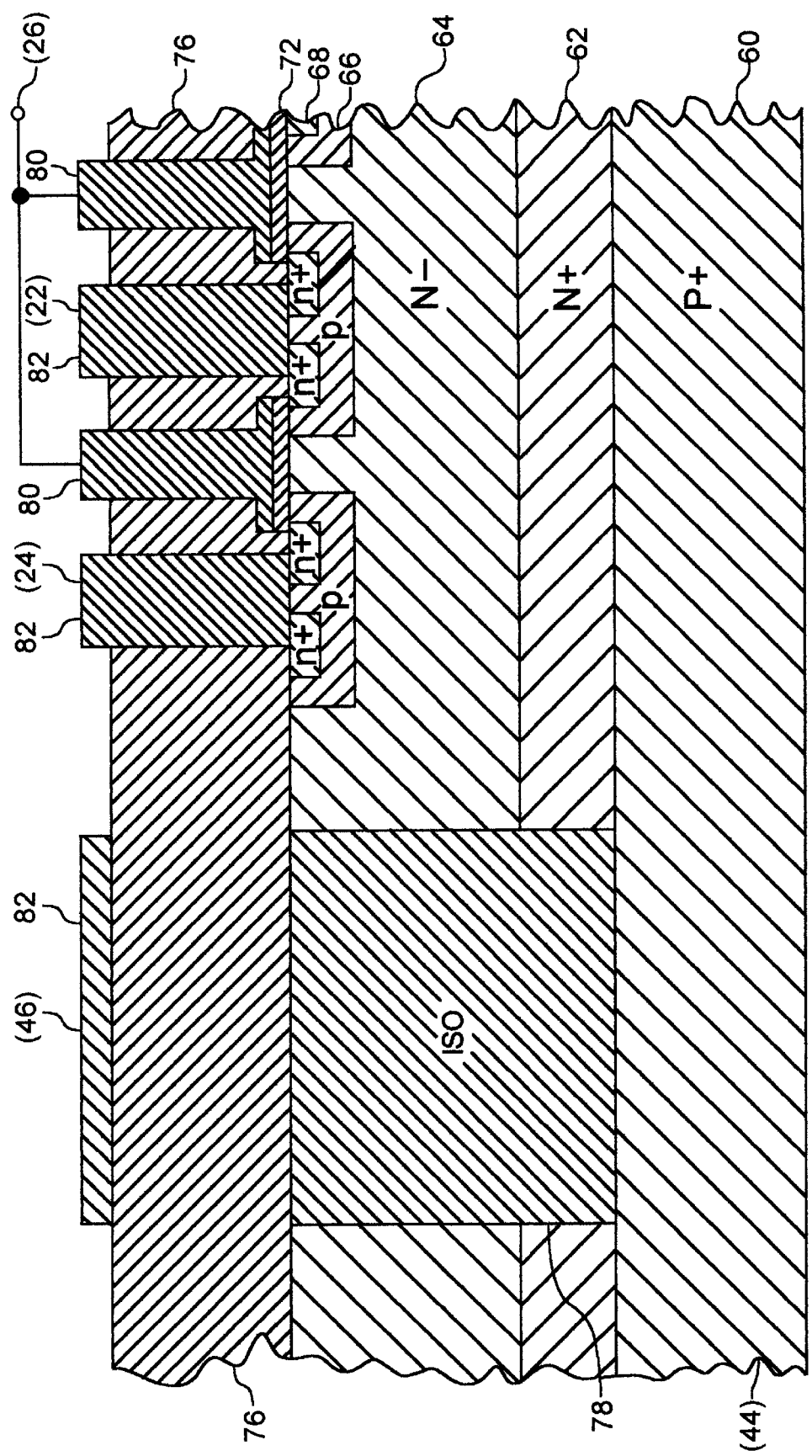
FIG. 4 is a cross-sectional view of a monolithic integrated circuit including a double emitter IGBT and feedback capacitor, in accordance with another aspect of the present invention.

In accordance with another aspect of the present invention, feedback capacitor CFB is preferably formed along with IGBT 20 on a single monolithic integrated circuit 56 as shown by dashed outline in FIG. 3, wherein circuit 56 may be fabricated in accordance with known circuit fabrication processes. Referring now to FIG. 4, one preferred implementation of circuit 56 including IGBT 20 and feedback capacitor CFB is shown in cross section. It bears pointing out, however, that only a few cells (emitters) of IGBT 20 are shown in FIG. 4 for ease of illustration. Construction of circuit 56 begins with a P+ substrate 60 upon which a N+ buffered layer 62 is either grown or deposited. The P+ substrate 60 corresponds to the collector 28 of IGBT 20 as well as the end 44 of feedback capacitor CFB as shown in FIGS. 2 and 3. A N-epitaxial layer 64 is grown or otherwise deposited onto N+ layer 64, and a p-type isolation region 78 is diffused or otherwise implanted into and through N-epitaxial layer 64 and N+ buried layer 62 such that isolation region 78 forms an ohmic contact with the P+ substrate 60.

An electrical insulation layer 76, preferably formed of glass ($SiO_2$), silicon nitride ($SiN_3$), polyimide, or the like, is grown or otherwise deposited on the N-epitaxial layer 64 and isolation region 78. Electrical insulation layer 76, sometimes referred to as a "field oxide" layer, is selectively removed in areas that will contain active IGBT cells, and a gate oxide 72 is grown or otherwise deposited in these areas. A layer of conductive gate material 80, preferably polysilicon, is deposited or otherwise grown on top of the gate oxide layer 72, and layers 72 and 80 are then patterned to form the gate 26 of IGBT 20.

A series of equally spaced apart p-type wells 66 are diffused or otherwise implanted into the N-epitaxial layer 64 such that a portion of gate oxide 72 overlaps adjacent p-wells 66. Within each of the p-wells 66, a pair of equally spaced apart n+ wells 68 are diffused or otherwise implanted therein. The p-well 66 and n+ well 68 pairs thus define a series of IGBT "cells" within the N-epitaxial layer 64. The foregoing IGBT 20 structure has been described as being constructed in accordance with a known self-aligned gate fabrication process, although it should be understood that IGBT 20 may alternatively be constructed in accordance with any known semiconductor fabrication process.

In any case, a first number of the p-well 66 and n+ well 68 pairs are electrically connected via a metalization layer 82 to form the main emitter 22 of IGBT 20, and a second lesser number of the p-well 66 and n+ well 68 pairs are separately electrically connected via a metalization layer 82 to form the sense emitter 24 of IGBT 20. A ratio of the number of main emitter 22 cells and sense emitter 24 cells determines a corresponding ratio of collector current that flows therethrough as is known in the art, and a typical ratio of main emitter 22 cells to sense emitter 24 cells is 100:1.

On top of electrical insulation layer 76, and remote from the IGBT main emitter 22 and sense emitter 24 cells, another metalization layer 82 is formed over the isolation region 78 to form the opposite end 46 of the feedback capacitor CFB. The surface area of isolation region 78, coverage area of the metalization layer 82 that forms capacitor end 46 relative to isolation region 78, and the thickness and dielectric characteristics of electrical insulation layer 76 define the capacitance value of feedback capacitor CFB, as is known in the art. The dimensions of isolation region 78 and metalization layer 82 covering region 78 may thus be configured to provide for a desired capacitance value of feedback capacitor CFB.

In any case, it should be apparent from FIG. 4 that the feedback capacitor CFB may be integrated into an IGBT circuit using an existing semiconductor fabrication process conventionally used to form IGBT 20. Only one additional circuit connection to IGBT 20 is required, thereby simplifying the mechanical construction of the circuit 50 and increasing its reliability by reducing the total number of device interconnects. The typically lower value of capacitance available by such integration (as compared to discrete components) can be offset by an increase in the impedance of the resistor string (R8, R9, RTRIM) across which the error amplifier 52 reference voltage is developed.

While the invention has been illustrated and described in detail in the foregoing drawings and description, the same is to be considered as illustrative and not restrictive in character, it being understood that only the preferred embodiment have been shown and described and that all changes and modifications that come within the spirit of the invention are desired to be protected. For example, the AC capacitive coupling of the collector 28 of IGBT 20 to the common connection of R8, RTRIM and D1 provides an additional benefit in that it permits leakage testing of the IGBT 20 after assembly of the complete circuit 50. This testing may be performed by applying a high voltage to the collector 28 of IGBT 20 and measuring the leakage current consumed by IGBT 20 when in the "off" state. Although the coupling of collector 28 of IGBT 20 to the common connection of R8, RTRIM and D1 may, in accordance with the present invention, be or include a DC compensation path, such as through a resistor, this leakage measurement of IGBT 20 would be perturbed by DC current flowing back into the control circuitry 58, and such leakage testing therefore could not easily be performed.

What is claimed is:

1. Circuitry for driving an electrical load and regulating a load current therethrough, comprising:
    a load driving device having a first input responsive to a control signal to conduct a first portion of a load current from a second input to a first output thereof and to conduct a remaining portion of said load current from said second input to a second output thereof;
    means for sensing said first portion of said load current and producing a sense signal corresponding thereto;
    means for generating a reference signal;
    a control circuit responsive to said sense and reference signals to provide said control signal at a first signal level when said sense signal is below said reference signal and to reduce said control signal to a load current regulating level as said sense signal approaches said reference signal, said load driving device responsive to said load current regulating level of said control signal to limit said load current therethrough to a regulated current level; and
    a feedback path establishing a feedback signal between said second input of said load driving device and said means for generating a reference signal, said feedback signal modulating said reference signal to maintain a substantially constant ratio of said first portion of said load current to said load current when said load driving device limits said load current to said regulated current level.

2. The circuitry of claim 1 further including an inductive load connected between a voltage source and said second input of said load driving device.

3. The circuitry of claim 2 wherein said feedback path includes a capacitor having one end connected to a common connection of said inductive load and said second input of said load driving device, and an opposite end connected to said means for generating a reference signal.

4. The circuitry of claim 3 wherein said means for generating a reference signal includes:
    a first resistor having one end connected to a current source and an opposite end; and
    a second resistor having one end connected to said opposite end of said first resistor and an opposite end connected to said first and second outputs of said load driving device;
    wherein said opposite end of said capacitor is connected to said first end of said second resistor.

5. The circuitry of claim 4 further including a diode having a cathode connected to said first end of said second resistor and an anode connected to said opposite end of said second resistor.

6. The circuitry of claim 5 wherein said first resistor includes a fixed-valued resistor in series with a variable resistor, said variable resistor adjustable in value to thereby set a voltage at said first end of said first resistor to a desired value.

7. The circuitry of claim 6 wherein said load driving device is an insulated gate bipolar transistor defining a gate corresponding to said first input of said load driving device, a collector corresponding to said second input of said load driving device, a first emitter corresponding to said first output of said load driving device and a second emitter corresponding to said second output of said load driving device.

8. The circuitry of claim 7 wherein said insulated gate bipolar transistor and said capacitor are formed on a first monolithic integrated circuit.

9. The circuitry of claim 8 wherein said means for sensing said first portion of said load current, said means for generating a reference signal and said control circuit are formed on a second monolithic integrated circuit separate from said first monolithic integrated circuit.

10. The circuitry of claim 1 wherein said feedback path includes a capacitor having one end connected to said second input of said load driving device and an opposite end connected to said means for generating a reference signal.

11. The circuitry of claim 10 wherein said means for generating a reference signal includes:
    a first resistor having one end connected to a current source and an opposite end; and
    a second resistor having one end connected to said opposite end of said first resistor and an opposite end connected to said first and second outputs of said load driving device;
    wherein said opposite end of said capacitor is connected to said first end of said second resistor.

12. The circuitry of claim 11 further including a diode having a cathode connected to said first end of said second resistor and an anode connected to said opposite end of said second resistor.

13. A method of driving an electrical load and regulating a load current therethrough, the method comprising the steps of:
    driving a load energizing device to permit a load current equivalent to that demanded by an electrical load connected to said load energizing device to flow therethrough;
    sensing a portion of said load current and producing a sense signal corresponding thereto;
    providing means for generating a reference signal;
    comparing said sense signal with said reference signal and driving said load energizing device to limit said load current therethrough to a regulated current level as said sense signal approaches said reference signal; and directing a feedback signal from a common connection of said electrical load and said load energizing device to said means for generating a reference signal, said feedback signal modulating said reference signal to maintaining a substantially constant ratio of said portion of said load current to said load current when said load energizing device limits said load current to said regulated current level.

14. The method of claim 13 wherein said means for generating a reference signal includes a first resistor having one end connected to a current source in series with a second resistor having an opposite end connected to a reference potential;

and wherein the step of directing a feedback signal includes directing said feedback signal to a common connection of said first and second resistors.

15. Circuitry for driving an electrical load and regulating a load current therethrough, comprising:

an insulated gate bipolar transistor (IGBT) having a gate, a collector and at least two emitters, said IGBT responsive to a gate drive signal to conduct a first portion of a load current flowing through said IGBT from said collector to a first one of said at least two emitters and a second portion of said load current from said collector to a second one of said at least two emitters;

a current sensor sensing said first portion of said load current and producing a sense signal corresponding thereto;

a reference signal generating circuit generating a reference signal;

a control circuit responsive to said sense and reference signals to control said gate drive signal to a load current regulating level as said sense signal approaches said reference signal said IGBT responsive to said load current regulating level of said gate drive signal to limit said load current therethrough to a regulated current level; and a feedback path establishing a feedback signal between said collector and said reference signal generating circuit, said feedback signal modulating said reference signal in proportion to changes in a voltage between said collector and at least one of said at least two emitters to maintain a substantially constant ratio of said first portion of said load current to said load current when said IGBT limits said load current to said regulated current level.

16. The circuitry of claim 15 wherein said feedback path includes a capacitor having one end connected to said collector and an opposite end connected to said reference signal generating circuit.

17. The circuitry of claim 16 wherein said reference signal generating circuit includes:

a first resistor having one end connected to a source of current and an opposite end; and a second resistor having one end connected to said opposite end of said first resistor and an opposite end connected to said at least two emitters of said IGBT;

wherein said opposite end of said capacitor is connected to said first end of said second resistor.

18. The circuitry of claim 17 further including a diode having a cathode connected to said first end of said second resistor and an anode connected to said opposite end of said second resistor.

19. The circuitry of claim 17 wherein said first resistor includes a fixed-valued resistor connected in series with a variable resistor, said variable resistor adjustable in value to thereby set a voltage at said first end of said first resistor to a desired value.

20. The circuitry of claim 15 further including an inductive load connected between a voltage source and said collector.

* * * * *